US006744130B1

(12) United States Patent
Miller et al.

(10) Patent No.: US 6,744,130 B1
(45) Date of Patent: Jun. 1, 2004

(54) ISOLATED STRIPLINE STRUCTURE (75) Inventors: Leah M. Miller, Fremont, CA (US); Aritharan Thurairajaratnam, San Jose, CA (US); Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/615,063

(22) Filed: Jul. 8, 2003

(51) Int. Cl.[7] .............................................. H01L 23/48
(52) U.S. Cl. ....................... 257/700; 257/691; 257/692; 257/782
(58) Field of Search ................................. 257/678–692, 257/758–760, 700, 782

(56) References Cited

U.S. PATENT DOCUMENTS 5,714,801 A * 2/1998 Yano et al. ................. 257/691
6,184,477 B1 * 2/2001 Tanahashi ................... 174/261
6,586,828 B2 * 7/2003 Buffet et al. ................ 257/691

* cited by examiner

Primary Examiner—Nathan J. Flynn
Assistant Examiner—Leonardo Andujar
(74) Attorney, Agent, or Firm—Luedeka, Neely & Graham, P.C.

(57) ABSTRACT

A package substrate having separate routing layers for transmitter signals and receiver signals, which signals are routed in differential pairs. The differential pairs of signal routing lines are isolated between a separate ground plane for transmitter and receiver traces and dedicated power planes, where a single power plane is dedicated to a single differential pair of signal routing lines. In this manner, a high degree of electrical isolation exists not only between the transmitter signal traces and the receiver signal traces, which are on different layers, but also between different differential pairs of signal routing lines on the same layer, each of which has its own dedicated power plane. Thus, a very high speed core routing system can be designed in a package substrate that can then be adapted as necessary to support a broad range of different integrated circuit designs.

20 Claims, 6 Drawing Sheets

ISOLATED STRIPLINE STRUCTURE

FIELD

This invention relates to the field of integrated circuit fabrication. More particularly, this invention relates to packaging for integrated circuits.

BACKGROUND

Some types of integrated circuits are completely custom designed, where each of the electrical devices in the integrated circuit is specifically selected for the custom design, and the integrated circuit is laid out in a customize manner. Such integrated circuits tend to have a relatively large amount of overhead associated with them. For example, there is a large amount of design work involved in producing such a customized integrated circuit. Further, customized mask sets and tooling are required to produce the integrated circuits. When it is expected that a very large number of the integrated circuits will be sold, then it can be cost effective to invest in the overhead associated with the customized integrated circuit, as the overhead can be paid off over a large number of the integrated circuits.

However, there are other applications where such a large number of sales of the integrated circuit is not expected. In these applications, it tends to be cost prohibitive to design the integrated circuit from scratch, so to speak, and to invest in completely customized mask sets and tooling, because there will not be enough of the integrated circuits fabricated to justify such a large investment.

For these smaller-number applications, a different type of integrated circuit is commonly used, called an application specific integrated circuit, or ASIC. ASICs are designed using standardized design elements, or modules, which are combined in a desired configuration to support the intended application. In other words, the design of the integrated circuit is application-specific, as the name implies. ASICs tend to be much cheaper to design and produce than custom integrated circuits, because the standardized design elements have already been designed. Further, mask designs already exist for the design elements. Thus, there is a tremendous head-start on the design process, and ASICs therefore tend to be much less expensive to fabricate than completely customized integrated circuits.

Unfortunately, because the standardized design elements of an ASIC can be combined in a variety of ways, the cost savings associated with standardization have typically not been extended to the packaging used for the ASICs, or the printed circuit boards to which they are ultimately mounted. For example, because different ASICs—even those using similar standardized modules—tend to be laid out with the standardized modules in different configurations, the package substrate and printed circuit board typically require a different configuration for each such design. Thus, all the costs of a completely customized package design tend to be incurred, even when using standardized modules in an ASIC design.

What is needed, therefore, are package substrate and printed circuit board designs with standardized elements for use with an ASIC, which designs can help reduce the costs associated with designing packages and circuit boards for different ASICs.

SUMMARY

The above and other needs are met by a package substrate adapted to receive an integrated circuit. The package substrate includes an upper contact layer, a transmitter power layer, a transmitter ground layer, a transmitter routing layer disposed between the transmitter power layer and the transmitter ground layer, a receiver power layer, a receiver ground layer, a receiver routing layer disposed between the receiver power layer and the receiver ground layer, and a lower contact layer.

Electrically conductive contacts are disposed in transceiver core contact patterns on the upper contact layer, and are adapted to make electrical connections with the integrated circuit. Each of the transceiver core contact patterns includes several different kinds of contacts, as described below.

Two transmitter signal contacts are disposed in a transmitter signal contact differential pair adapted to conduct transmitter signals. Two receiver signal contacts are disposed in a receiver signal contact differential pair adapted to conduct receiver signals. Transmitter power contacts are disposed in a transmitter power contact group and adapted to provide power for only the transmitter signals conducted by the transmitter signal contact differential pair. Receiver power contacts are disposed in a receiver power contact group and adapted to provide power for only the receiver signals conducted by the receiver signal contact differential pair. Ground contacts are adapted to provide ground for both the transmitter signals and the receiver signals.

Electrically conductive transmitter signal traces are disposed in transmitter signal trace differential pairs on the transmitter routing layer. Electrically conductive transmitter signal vias are disposed in transmitter signal via differential pairs, which electrically connect the transmitter signal trace differential pairs with the transmitter signal contact differential pairs.

Electrically conductive transmitter power planes are disposed on the transmitter power layer, and electrically conductive transmitter power vias electrically connect the transmitter power planes with the transmitter power contact groups. Electrically conductive transmitter ground vias electrically connect the transmitter ground layer with the ground contacts.

A given one of each of the transmitter power planes is associated with and aligned with a given one of each of the transmitter signal trace differential pairs. The association is based on the given one of the transmitter power planes and the given one of the transmitter signal trace differential pairs being electrically connected to contacts disposed within a single one of the transceiver core contact patterns.

Similarly, electrically conductive receiver signal traces are disposed in receiver signal trace differential pairs on the receiver routing layer. Electrically conductive receiver signal vias are disposed in receiver signal via differential pairs, and electrically connect the receiver signal trace differential pairs with the receiver signal contact differential pairs.

Electrically conductive receiver power planes are disposed on the receiver power layer, and electrically conductive receiver power vias electrically connect the receiver power planes with the receiver power contact groups. Electrically conductive receiver ground vias electrically connect the receiver ground layer with the ground contacts.

A given one of each of the receiver power planes is associated with and aligned with a given one of each of the receiver signal trace differential pairs. The association is based on the given one of the receiver power planes and the given one of the receiver signal trace differential pairs being electrically connected to contacts disposed within a single one of the transceiver core contact patterns.

Lower electrical contacts are disposed on the lower contact layer and are electrically connected to the transmitter signal traces, the transmitter power planes, the transmitter ground layer, the receiver signal traces, the receiver power planes, and the receiver ground layer. None of the receiver signal traces in the package substrate are disposed on the transmitter routing layer and none of the transmitter signal traces in the package substrate are disposed on the receiver routing layer.

In this manner, none of the differential transmitter trace pairs are on the same layer as, nor can they interfere with the differential receiver trace pairs. Further, each differential trace pair, whether they be for receiver signals or transmitter signals, is isolated by a ground plane on one side, and a dedicated power plane on the other side, which power plane the trace pair does not share with any other trace pair. Thus, the package substrate is cross-talk tolerant to very high speed core devices. Thus, a package substrate according to the present invention has standardized transceiver contact patterns and routing layers, which can be used with a wide variety of different ASIC designs, thereby lowering the costs associated with packaging the different ASIC devices.

In various preferred embodiments, the transmitter routing layer is disposed above the receiver routing layer. The transmitter power layer is preferably disposed below the transmitter routing layer and the transmitter ground layer is preferably disposed above the transmitter routing layer. In one embodiment, there is a second transmitter ground layer disposed beneath the transmitter power layer. Preferably the receiver power layer is disposed below the receiver routing layer and the receiver ground layer is disposed above the receiver routing layer. In one embodiment, there is a second receiver ground layer disposed below the receiver power layer.

A packaged integrated circuit including an integrated circuit and the package substrate described above is also described herein.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
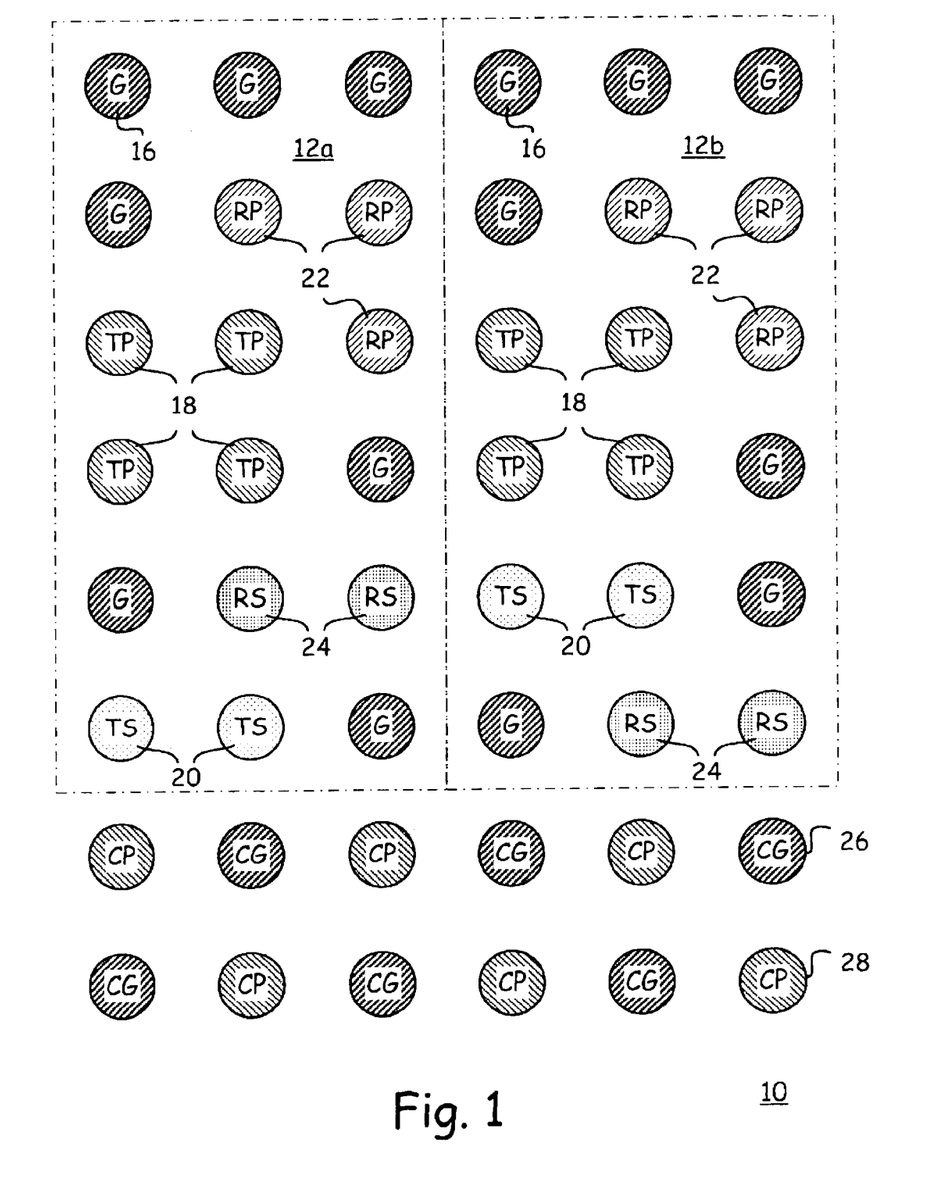
FIG. 1 is a top plan view of the contact layer of a platform according to a preferred embodiment of the present invention.

With reference now to FIG. 1, there is depicted a top plan view of the contact layer of a platform 10 according to a preferred embodiment of the present invention. The term "platform" as used herein refers to both a package substrate and a printed circuit board, and is used for convenience so as to not become unduly repetitive by referencing both the package substrate and the printed circuit board in all relevant instances. The platform 10 may be a package substrate that is adapted to receive an integrated circuit, such as an ASIC, and make electrical connections with the integrated circuit through the electrical contacts available at the top surface of the platform 10, as described with more particularity herein. However, the platform 10 may also be a printed circuit board that is adapted to receive a packaged integrated circuit, or a bare integrated circuit in some specialized embodiments, and make electrical connections with the packaged integrated circuit through the electrical contacts available at the top surface of the platform 10. Any electrical connection technology can work with the present invention, including ball grid array and chip scale package connections. Further, the invention is compatible with many different printed circuit board types and package types, including ceramic and plastic, and with either wire bond or flip chip devices.

Depicted in FIG. 1 are two transceiver blocks 12a and 12b. The transceiver blocks 12a and 12b are delineated in FIG. 1 by phantom lines. It is appreciated that in actual implementation, no such lines physically exist on the platform 10 structure. The phantom lines are depicted in the figures for the purposes of more clearly explaining the construction of the blocks 12a and 12b according to the present invention.

As depicted in FIG. 1, the transceiver blocks 12a and 12b are each preferably constructed with eighteen electrically conductive contacts in an array of three columns by six rows. In the embodiment where the platform 10 is a package substrate, the electrically conductive contacts are adapted for making electrical connections between an integrated circuit connected to one portion of the package substrate and a printed circuit board connected to other portions of the package substrate. In the embodiment where the platform 10 is a printed circuit board, the electrically conductive contacts are adapted for making electrical connections between a packaged integrated circuit connected to one portion of the printed circuit board and other circuitry connected to other portions of the printed circuit board.

In the preferred embodiment, each transceiver block 12 has four dedicated transmitter power contacts 18 and three dedicated receiver power contacts 22. The transceiver blocks 12 preferably also have six common ground contacts 16, which are shared by both the two transmitter signal contacts 20 and the two receiver signal contacts 24. The two transmitter signal contacts 20 are preferably configured as a differential signal pair, and are most preferably disposed adjacent one another. Similarly, the two receiver signal contacts 24 are preferably configured as a differential signal pair, and are most preferably disposed adjacent one another. Also depicted in FIG. 1 are additional rows of core ground contacts 26 and core power contacts 28, which are not within the repeating transceiver blocks 12.

Figure 2:
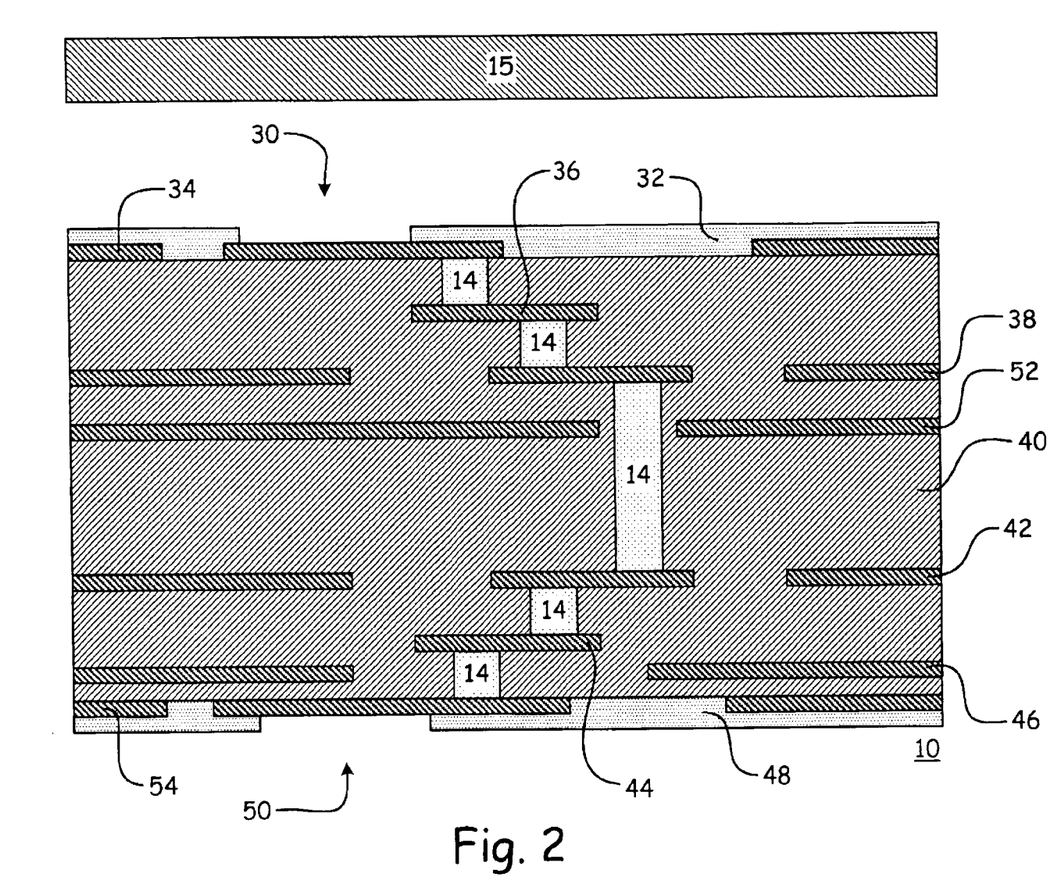
FIG. 2 is a cross section view of a package substrate depicting the separate transmitter layer and receiver layer.

With reference now to FIG. 2 there is depicted a cross sectional view of a portion of a packaged integrated circuit, including an integrated circuit 15 and a package substrate 10, depicting the separate transmitter routing layer 36 and receiver routing layer 44. It is appreciated that in various embodiments, the layer 36 may be either the transmitter routing layer or the receiver routing layer, but in the preferred embodiment the transmitter routing layer is disposed above the receiver routing layer. As used herein, references to layers being "upper" layers or "above" another layer have reference to layers that are closer to the integrated circuit 15 side of the package substrate 10, while references to layers being "lower" layers or "below" another layer have reference to layers that are farther from the integrated circuit 15 side of the package substrate 10.

Disposed on either side of the transmitter routing layer 36 are a transmitter ground layer 34 and a transmitter power layer 38. It is appreciated that in alternate embodiments the transmitter ground layer could be below the transmitter routing layer and the transmitter power layer could be above the transmitter routing layer. However, in the preferred embodiment the transmitter ground layer 34 is disposed above the transmitter routing layer 36, and the transmitter power layer 38 is disposed below the transmitter routing layer 36, as depicted in FIG. 2.

Similarly, disposed on either side of the receiver routing layer 44 are a receiver ground layer 42 and a receiver power layer 46. It is appreciated that in alternate embodiments the receiver ground layer could be below the receiver routing layer and the receiver power layer could be above the receiver routing layer. However, in the preferred embodiment the receiver ground layer 42 is disposed above the receiver routing layer 44, and the receiver power layer 46 is disposed below the receiver routing layer 44, as depicted in FIG. 2.

In a six layer package substrate 10, the various electrically conductive layers are disposed as described above, with electrically nonconductive layers disposed between them. However, in an eight layer package substrate, there are preferably two additional electrically conductive layers 52 and 54 in the package substrate 10. The two additional layers 52 and 54 are preferably a second transmitter ground layer 52 and a second receiver ground layer 54. The second transmitter ground layer 52 most preferably resides below the transmitter power layer 38. Similarly, the second receiver ground layer 54 most preferably resides below the receiver power layer 46.

The functions of the layers can be changed for an eight layer symmetric switching scenario, which is a specialized embodiment. In such an embodiment, the routing layer is bounded on either side by a ground layer, with a power layer disposed between one of the ground layers and the routing layer, while in the standard embodiment the routing layer is bounded on either side by a power layer, with a ground layer disposed adjacent one of the power layers. Thus, in this specialized embodiment, one of each of the two ground layers for the transmitter routing layer 36 and the receiver routing layer 44 is changed to a second power layer.

FIG. 2 also depicts contact openings 30 in the upper solder mask layer 32, where connections are made to the integrated circuit 15. This comprises an upper contact layer, which is coplanar in this embodiment with the transmitter ground layer 34. Contact openings 50 in the lower solder mask layer 48 provide connections to external circuitry. This comprises a lower contact layer, which is coplanar in this embodiment with the second receiver ground layer 54. Electrically conductive vias 14 provide electrical connections from the contacts 30 and 50 on either side of the package substrate 10 through the various electrically nonconductive layers and between the various electrically conductive layers, as depicted.

Figure 3:
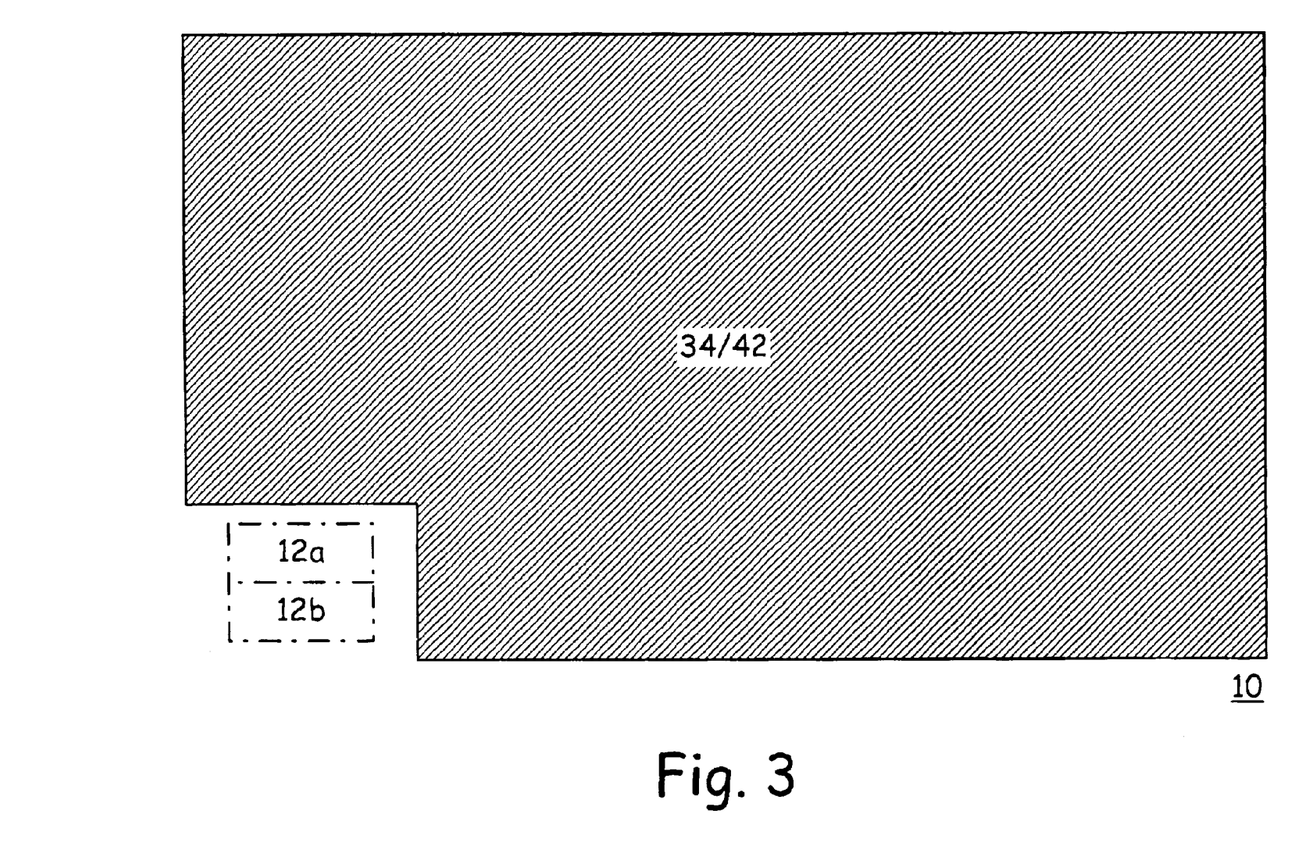
FIG. 3 is a top plan view of a ground reference layer for either the transmitter layer or the receiver layer.

With reference now to FIG. 3, there is depicted an electrically conductive ground layer of the package substrate 10, which may be either a transmitter ground layer 34 or a receiver ground layer 42. The phantom blocks 12a and 12b depict a generalized projected location for the transceiver blocks 12a and 12b from the upper contact layer, and are provided for a reference. As depicted, the ground layer tends to be a relatively large, unbroken conductive sheet. It is appreciated that there are preferably openings in the sheet for via contacts that must pass through the ground layer. The ground layer, as described above, is electrically connected to the appropriate ground contacts in the transceiver pattern block 12.

Figure 4:
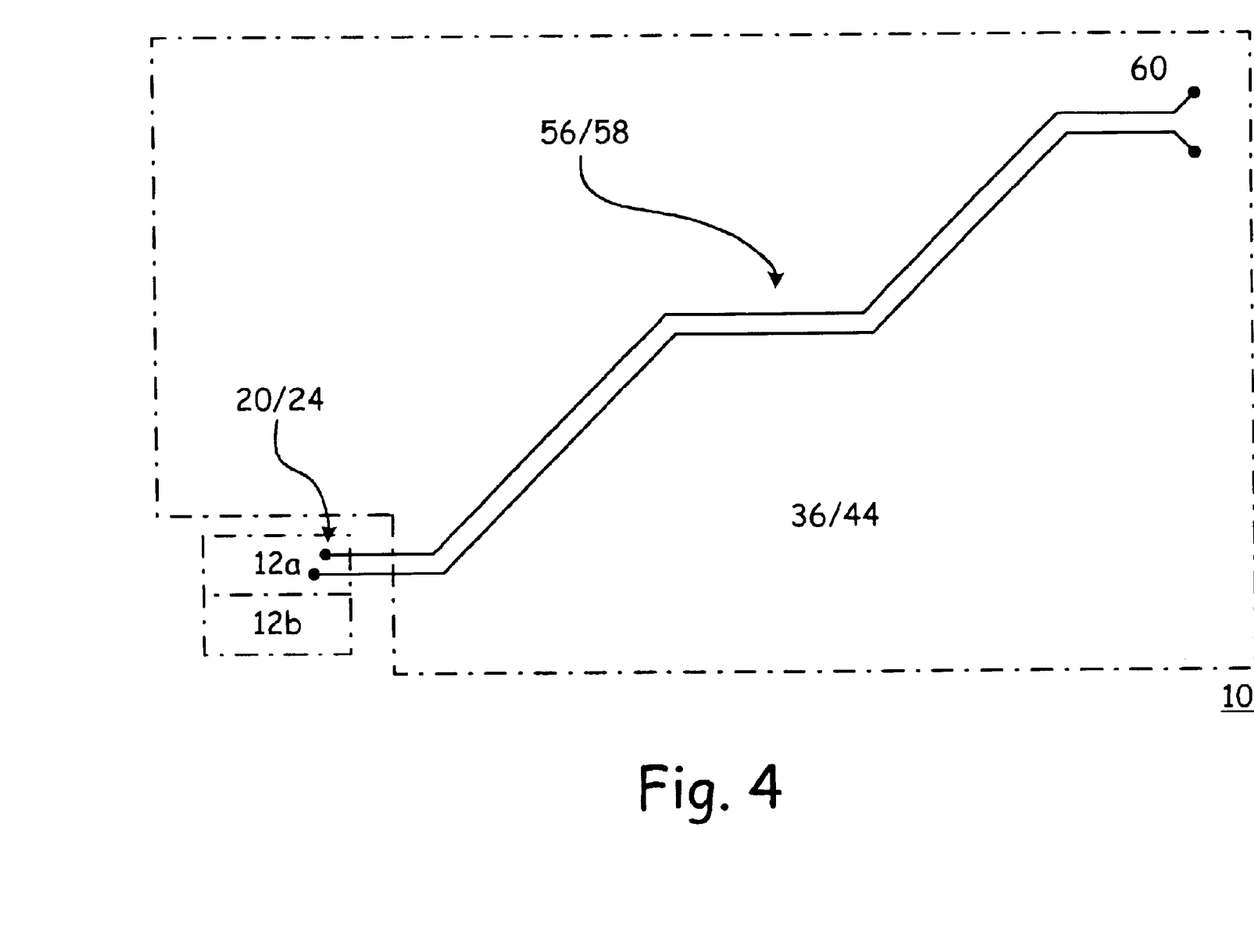
FIG. 4 is a top plan view of a signal routing layer for either the transmitter layer or the receiver layer.

FIG. 4 depicts a signal routing layer of the package substrate 10, which may be either a transmitter routing layer 36 or a receiver routing layer 44. Again, the phantom blocks 12a and 12b depict a generalized projected location for the transceiver blocks 12a and 12b from the upper contact layer, and are provided for a reference. The signal routing layer includes transmitter signal traces 56 or receiver signal traces 58, but not both. Preferably, a routing layer includes one or the other type of signal traces, but not both, so that there is a greater degree of electrical isolation between the two different kinds of signal, be they transmitter or receiver.

The signal traces 56/58 are preferably disposed in differential pairs, which are kept in close proximity one to another to improve the signal quality, where the spacing is preferably determined by the differential pair impedance that is required or desired. The signal traces 56/58 are connected to signal vias 20/24, which are either transmitter signal vias 20 or receiver signal vias 24, which are also disposed in differential pairs. The signal traces 56/58 route the signals to contacts 60 at the distal end of the differential pair of signal traces 56/58.

Figure 5:
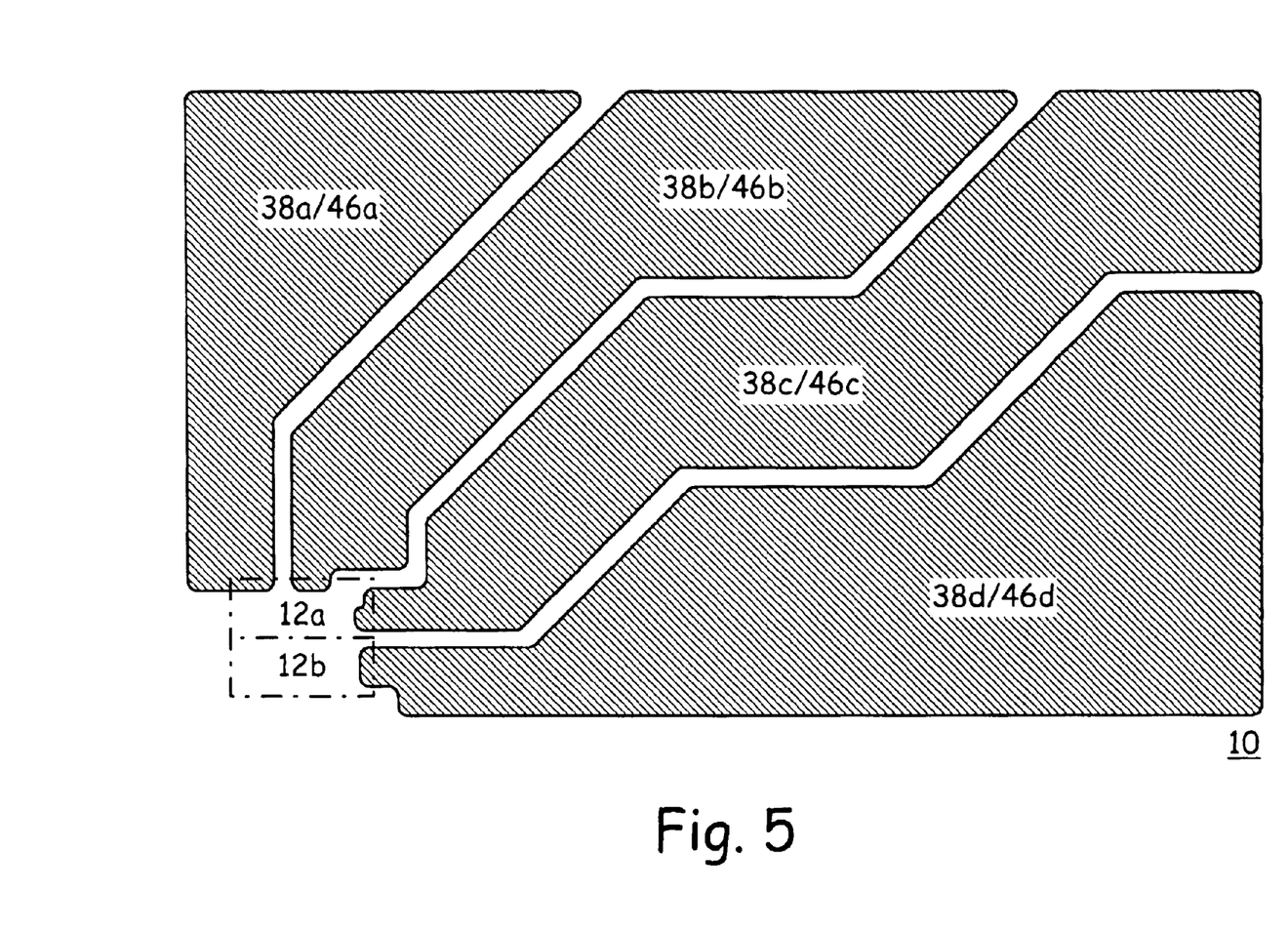
FIG. 5 is a top plan view of a power reference layer for either the transmitter layer or the receiver layer.

FIG. 5 depicts a power layer of the package substrate 10, which may be either a transmitter power layer 38 or a receiver power layer 46. As depicted, the power layer 38/46 is preferably split into several power planes a–d, the purpose of which are described in more detail hereafter. The power planes a–d are electrically connected to the respective power contacts, either transmitter power contacts 18 or receiver power contacts 22 as appropriate in the transceiver array block 12. Specifically, the power planes 38a–d are electrically connected to the transmitter power contacts 18 in the transceiver array 12 if the power layer is a transmitter power layer 38. Similarly, the power planes 46a–d are electrically connected to the receiver power contacts 22 in the transceiver array 12 if the power layer is a receiver power layer 46.

Figure 6:
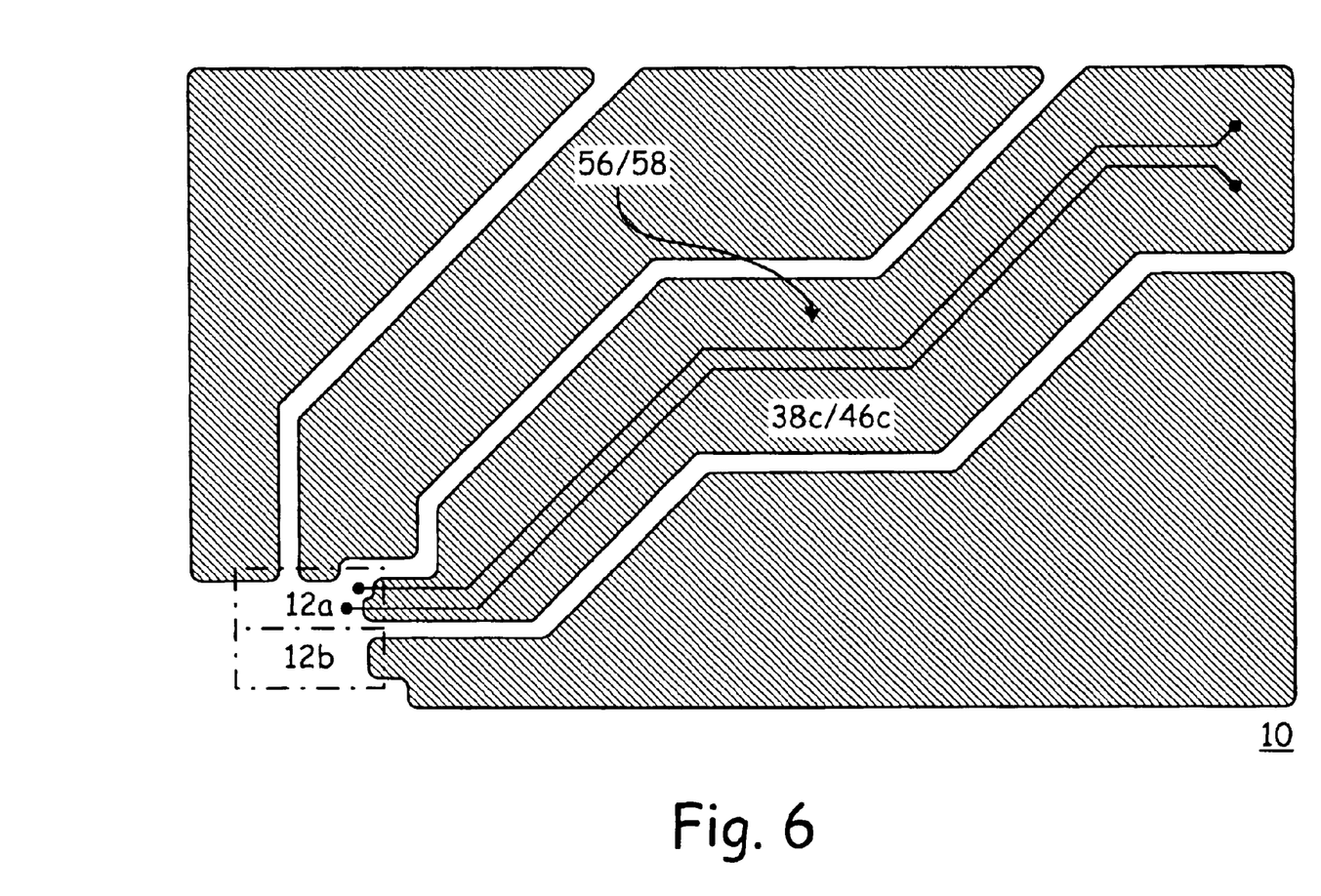
FIG. 6 is a composite top plan view of a power reference layer overlaid with a signal routing layer.

FIG. 6 is a composite depiction of the power layer overlaid with the signal routing layer, to better illustrate how the power planes are associated with the signal routing traces. As depicted, only a single differential pair of signal traces 56/58 is associated with and is aligned with a given power plane 38/46. In this manner, the signal traces 56/58 are provide with a relatively high degree of electrical isolation one from another, even while residing on the same routing layer.

The association between power planes and signal traces is based on the transceiver block 12. Signal traces that are electrically connected to transmitter or receiver contacts within a given transceiver block 12 are associated with and overlie power planes that are electrically connected to power contacts within the same transceiver block 12.

Specifically, differential transmitter signal trace pairs 56 that are electrically connected to transmitter signal contacts 20 within a given transceiver block 12a, are associated with and overlie a power plane 38c that is electrically connected to transmitter power contacts 18 within the same transceiver block 12a. Similarly, differential receiver signal trace pairs 58 that are electrically connected to receiver signal contacts 24 within a given transceiver block 12a, are associated with and overlie power plane 46c that is electrically connected to receiver power contacts 22 within the same transceiver block 12a. Thus, paired and dedicated power within a transceiver block is used within an isolation plane for associated signal traces.

Lower electrical contacts 50 are disposed on the lower contact layer 46 and are electrically connected to the transmitter signal traces, the transmitter power planes, the transmitter ground layer, the receiver signal traces, the receiver power planes, and the receiver ground layer. Thus, a package substrate 10 according to the present invention provides isolation not only between transmitter signals and receiver signals, by placing them on separate routing layers, but also provides isolation between differential pairs of signal traces on the same layer, by sandwiching them between associated dedicated isolating power planes and common ground planes. In this manner, a very high speed transceiver core design can be used in a semi-custom package substrate design, which can accommodate a wide variety of different integrated circuit designs.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A package substrate adapted to receive an integrated circuit, the package substrate comprising:
   an upper contact layer,
   a transmitter power layer,
   a transmitter ground layer,
   a transmitter routing layer disposed between the transmitter power layer and the transmitter ground layer,
   a receiver power layer,
   a receiver ground layer,
   a receiver routing layer disposed between the receiver power layer and the receiver ground layer,
   a lower contact layer,
   electrically conductive contacts disposed in transceiver core contact patterns on the upper contact layer and adapted to make electrical connections with the integrated circuit, each of the transceiver core contact patterns including,
     two transmitter signal contacts disposed in a transmitter signal contact differential pair and adapted to conduct transmitter signals,
     two receiver signal contacts disposed in a receiver signal contact differential pair and adapted to conduct receiver signals,
     transmitter power contacts disposed in a transmitter power contact group and adapted to provide power for only the transmitter signals conducted by the transmitter signal contact differential pair,
     receiver power contacts disposed in a receiver power contact group and adapted to provide power for only the receiver signals conducted by the receiver signal contact differential pair, and
     ground contacts adapted to provide ground for both the transmitter signals and the receiver signals,
   electrically conductive transmitter signal traces disposed in transmitter signal trace differential pairs on the transmitter routing layer,
   electrically conductive transmitter signal vias disposed in transmitter signal via differential pairs electrically connecting the transmitter signal trace differential pairs with the transmitter signal contact differential pairs,
   electrically conductive transmitter power planes disposed on the transmitter power layer,
   electrically conductive transmitter power vias electrically connecting the transmitter power planes with the transmitter power contact groups,
   electrically conductive transmitter ground vias electrically connecting the transmitter ground layer with the ground contacts,
   where a given one of each of the transmitter power planes is associated with and aligned with a given one of each of the transmitter signal trace differential pairs, where the association is based on the given one of the transmitter power planes and the given one of the transmitter signal trace differential pairs being electrically connected to contacts disposed within a single one of the transceiver core contact patterns,
   electrically conductive receiver signal traces disposed in receiver signal trace differential pairs on the receiver routing layer,
   electrically conductive receiver signal vias disposed in receiver signal via differential pairs electrically connecting the receiver signal trace differential pairs with the receiver signal contact differential pairs,
   electrically conductive receiver power planes disposed on the receiver power layer,
   electrically conductive receiver power vias electrically connecting the receiver power planes with the receiver power contact groups,
   electrically conductive receiver ground vias electrically connecting the receiver ground layer with the ground contacts,
   where a given one of each of the receiver power planes is associated with and aligned with a given one of each of the receiver signal trace differential pairs, where the association is based on the given one of the receiver power planes and the given one of the receiver signal trace differential pairs being electrically connected to contacts disposed within a single one of the transceiver core contact patterns, and
   lower electrical contacts disposed on the lower contact layer and electrically connected to the transmitter signal traces, the transmitter power planes, the transmitter ground layer, the receiver signal traces, the receiver power planes, and the receiver ground layer,
   where none of the receiver signal traces in the package substrate are disposed on the transmitter routing layer and none of the transmitter signal traces in the package substrate are disposed on the receiver routing layer.

2. The package substrate of claim 1, wherein the transmitter routing layer is disposed above the receiver routing layer.

3. The package substrate of claim 1, wherein there are no electrically conductive layers disposed between the transmitter routing layer and the transmitter ground layer.

4. The package substrate of claim 1, further comprising a second transmitter ground layer disposed below the transmitter power layer.

5. The package substrate of claim 1, wherein the transmitter power layer is disposed below the transmitter routing layer and the transmitter ground layer is disposed above the transmitter routing layer.

6. The package substrate of claim 1, wherein there are no electrically conductive layers disposed between the receiver routing layer and the receiver ground layer.

7. The package substrate of claim 1, further comprising a second receiver ground layer disposed below the receiver power layer.

8. The package substrate of claim 1, wherein the receiver power layer is disposed below the receiver routing layer and the receiver ground layer is disposed above the receiver routing layer.

9. A package substrate adapted to receive an integrated circuit, the package substrate comprising:
an upper contact layer,
a transmitter routing layer,
a transmitter ground layer disposed above the transmitter routing layer,
a transmitter power layer disposed beneath the transmitter routing layer,
a receiver routing layer,
a receiver ground layer disposed above the receiver routing layer,
a receiver power layer disposed beneath the receiver routing layer,
a lower contact layer,
electrically conductive contacts disposed in transceiver core contact patterns on the upper contact layer and adapted to make electrical connections with the integrated circuit, each of the transceiver core contact patterns including,
two transmitter signal contacts disposed in a transmitter signal contact differential pair and adapted to conduct transmitter signals,
two receiver signal contacts disposed in a receiver signal contact differential pair and adapted to conduct receiver signals,
transmitter power contacts disposed in a transmitter power contact group and adapted to provide power for only the transmitter signals conducted by the transmitter signal contact differential pair,
receiver power contacts disposed in a receiver power contact group and adapted to provide power for only the receiver signals conducted by the receiver signal contact differential pair, and
ground contacts adapted to provide ground for both the transmitter signals and the receiver signals,
electrically conductive transmitter signal traces disposed in transmitter signal trace differential pairs on the transmitter routing layer,
electrically conductive transmitter signal vias disposed in transmitter signal via differential pairs electrically connecting the transmitter signal trace differential pairs with the transmitter signal contact differential pairs,
electrically conductive transmitter power planes disposed on the transmitter power layer,
electrically conductive transmitter power vias electrically connecting the transmitter power planes with the transmitter power contact groups,
electrically conductive transmitter ground vias electrically connecting the transmitter ground layer with the ground contacts,
where a given one of each of the transmitter power planes is associated with and aligned with a given one of each of the transmitter signal trace differential pairs, where the association is based on the given one of the transmitter power planes and the given one of the transmitter signal trace differential pairs being electrically connected to contacts disposed within a single one of the transceiver core contact patterns,
electrically conductive receiver signal traces disposed in receiver signal trace differential pairs on the receiver routing layer,
electrically conductive receiver signal vias disposed in receiver signal via differential pairs electrically connecting the receiver signal trace differential pairs with the receiver signal contact differential pairs,
electrically conductive receiver power planes disposed on the receiver power layer,
electrically conductive receiver power vias electrically connecting the receiver power planes with the receiver power contact groups,
electrically conductive receiver ground vias electrically connecting the receiver ground layer with the ground contacts,
where a given one of each of the receiver power planes is associated with and aligned with a given one of each of the receiver signal trace differential pairs, where the association is based on the given one of the receiver power planes and the given one of the receiver signal trace differential pairs being electrically connected to contacts disposed within a single one of the transceiver core contact patterns, and
lower electrical contacts disposed on the lower contact layer and electrically connected to the transmitter signal traces, the transmitter power planes, the transmitter ground layer, the receiver signal traces, the receiver power planes, and the receiver ground layer,
where none of the receiver signal traces in the package substrate are disposed on the transmitter routing layer and none of the transmitter signal traces in the package substrate are disposed on the receiver routing layer.

10. The package substrate of claim 9, wherein the transmitter routing layer is disposed above the receiver routing layer.

11. The package substrate of claim 9, further comprising a second transmitter ground layer disposed below the transmitter power layer.

12. The package substrate of claim 9, further comprising a second receiver ground layer disposed below the receiver power layer.

13. A packaged integrated circuit, comprising:
an integrated circuit, and
a package substrate adapted to receive the integrated circuit, the package substrate including,
an upper contact layer,
a transmitter power layer,
a transmitter ground layer,
a transmitter routing layer disposed between the transmitter power layer and the transmitter ground layer,
a receiver power layer,
a receiver ground layer,
a receiver routing layer disposed between the receiver power layer and the receiver ground layer,
a lower contact layer,
electrically conductive contacts disposed in transceiver core contact patterns on the upper contact layer and adapted to make electrical connections with the integrated circuit, each of the transceiver core contact patterns including, two transmitter signal contacts disposed in a transmitter signal contact differential pair and adapted to conduct transmitter signals, two receiver signal contacts disposed in a receiver signal contact differential pair and adapted to conduct receiver signals, transmitter power contacts disposed in a transmitter power contact group and adapted to provide power for only the transmitter signals conducted by the transmitter signal contact differential pair, receiver power contacts disposed in a receiver power contact group and adapted to provide power for only the receiver signals conducted by the receiver signal contact differential pair, and ground contacts adapted to provide ground for both the transmitter signals and the receiver signals, electrically conductive transmitter signal traces disposed in transmitter signal trace differential pairs on the transmitter routing layer, electrically conductive transmitter signal vias disposed in transmitter signal via differential pairs electrically connecting the transmitter signal trace differential pairs with the transmitter signal contact differential pairs, electrically conductive transmitter power planes disposed on the transmitter power layer, electrically conductive transmitter power vias electrically connecting the transmitter power planes with the transmitter power contact groups, electrically conductive transmitter ground vias electrically connecting the transmitter ground layer with the ground contacts, where a given one of each of the transmitter power planes is associated with and aligned with a given one of each of the transmitter signal trace differential pairs, where the association is based on the given one of the transmitter power planes and the given one of the transmitter signal trace differential pairs being electrically connected to contacts disposed within a single one of the transceiver core contact patterns, electrically conductive receiver signal traces disposed in receiver signal trace differential pairs on the receiver routing layer, electrically conductive receiver signal vias disposed in receiver signal via differential pairs electrically connecting the receiver signal trace differential pairs with the receiver signal contact differential pairs, electrically conductive receiver power planes disposed on the receiver power layer, electrically conductive receiver power vias electrically connecting the receiver power planes with the receiver power contact groups, electrically conductive receiver ground vias electrically connecting the receiver ground layer with the ground contacts, where a given one of each of the receiver power planes is associated with and aligned with a given one of each of the receiver signal trace differential pairs, where the association is based on the given one of the receiver power planes and the given one of the receiver signal trace differential pairs being electrically connected to contacts disposed within a single one of the transceiver core contact patterns, and lower electrical contacts disposed on the lower contact layer and electrically connected to the transmitter signal traces, the transmitter power planes, the transmitter ground layer, the receiver signal traces, the receiver power planes, and the receiver ground layer, where none of the receiver signal traces in the package substrate are disposed on the transmitter routing layer and none of the transmitter signal traces in the package substrate are disposed on the receiver routing layer.

14. The packaged integrated circuit of claim 13, wherein the transmitter routing layer is disposed above the receiver routing layer.

15. The packaged integrated circuit of claim 13, wherein there are no electrically conductive layers disposed between the transmitter routing layer and the transmitter ground layer.

16. The packaged integrated circuit of claim 13, further comprising a second transmitter ground layer disposed below the transmitter power layer.

17. The packaged integrated circuit of claim 13, wherein transmitter power layer is disposed below the transmitter routing layer and the transmitter ground layer is disposed above the transmitter routing layer.

18. The packaged integrated circuit of claim 13, wherein there are no electrically conductive layers disposed between the receiver routing layer and the receiver ground layer.

19. The packaged integrated circuit of claim 13, further comprising a second receiver ground layer disposed below the receiver power layer.

20. The packaged integrated circuit of claim 13, wherein receiver power layer is disposed below the receiver routing layer and the receiver ground layer is disposed above the receiver routing layer.

* * * * *